United States Patent
Park et al.

(10) Patent No.: US 11,062,742 B2
(45) Date of Patent: Jul. 13, 2021

(54) MEMORY SYSTEM CAPABLE OF IMPROVING STABILITY OF A DATA READ OPERATION OF INTERFACE CIRCUIT, AND METHOD OF OPERATING THE MEMORY SYSTEM

(71) Applicant: SK hynix Inc., Gyeonggi-do (KR)

(72) Inventors: Chang Kyun Park, Gyeonggi-do (KR); Young Sik Koh, Gyeonggi-do (KR); Seung Jin Park, Gyeonggi-do (KR); Dong Hyun Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/679,561

(22) Filed: Nov. 11, 2019

(65) Prior Publication Data
US 2020/0342919 A1    Oct. 29, 2020

(30) Foreign Application Priority Data

Apr. 23, 2019    (KR) .................. 10-2019-0047421

(51) Int. Cl.
*G11C 7/10* (2006.01)
*G11C 7/22* (2006.01)

(52) U.S. Cl.
CPC .......... *G11C 7/1006* (2013.01); *G11C 7/1063* (2013.01); *G11C 7/1066* (2013.01); *G11C 7/1093* (2013.01); *G11C 7/22* (2013.01)

(58) Field of Classification Search
CPC ... G11C 7/1006; G11C 7/1063; G11C 7/1066; G11C 7/1093; G11C 7/22
See application file for complete search history.

(56) References Cited

U.S. PATENT DOCUMENTS 6,738,880 B2 * 5/2004 Lai ................. G11C 7/1084
                                                                710/58
6,813,682 B2    11/2004 Bress et al.
7,339,838 B2    3/2008  LaBerge
(Continued)

FOREIGN PATENT DOCUMENTS

KR    10-2010-0099892    9/2010
KR    10-2014-0088730    7/2014
(Continued)

OTHER PUBLICATIONS

Kim,H.J. et al., 1GB/s 2Tb NAND Flash Multi-Chip Package with Frequency-Boosting Interface Chip, ISSCC 2015 Session 7.
(Continued)

*Primary Examiner* — Vanthu T Nguyen
(74) *Attorney, Agent, or Firm* — IP & T Group LLP

(57) ABSTRACT

The present technology includes a memory system and a method of operating the memory system. The memory system includes a memory device including an interface circuit, the interface circuit storing first system data, and a semiconductor memory; and a controller configured to output a read enable signal and a first read command for the first system data to the memory device. The semiconductor memory transfers a data strobe signal to the interface circuit in response to the read enable signal, the interface circuit reads the first system data in response to the first read command and transmits the read first system data to the controller in synchronization with the data strobe signal.

8 Claims, 13 Drawing Sheets

(56) References Cited

U.S. PATENT DOCUMENTS

| | | |
|---|---|---|
| 7,500,075 B1 | 3/2009 | Garrett, Jr. |
| 8,364,881 B2 | 1/2013 | Urabe |
| 9,025,384 B2 | 5/2015 | Lee et al. |
| 9,037,774 B2 | 5/2015 | Solomon et al. |
| 9,093,132 B2 | 7/2015 | Kim et al. |
| 9,536,590 B1 | 1/2017 | Zhu et al. |
| 10,002,652 B1 | 6/2018 | Seong et al. |
| 10,073,643 B2 * | 9/2018 | Jung ............... G06F 12/0246 |
| 10,229,743 B2 | 3/2019 | Han |
| 10,430,361 B1 | 10/2019 | Wiebe et al. |
| 10,496,332 B2 * | 12/2019 | Srivastava ........... G11C 29/028 |
| 10,714,162 B2 | 7/2020 | Koh |
| 10,747,463 B2 | 8/2020 | Kajigaya |
| 2002/0040418 A1 | 4/2002 | Bress et al. |
| 2002/0069381 A1 | 6/2002 | Jeong et al. |
| 2004/0186953 A1 | 9/2004 | Bress et al. |
| 2004/0193834 A1 | 9/2004 | Emberling |
| 2006/0053353 A1 | 3/2006 | Youn et al. |
| 2007/0206400 A1 | 9/2007 | Bress et al. |
| 2008/0030221 A1 | 2/2008 | Lee et al. |
| 2008/0080226 A1 | 4/2008 | Mikolajick et al. |
| 2008/0123217 A1 | 5/2008 | Ishii |
| 2009/0016124 A1 | 1/2009 | Kim |
| 2009/0080374 A1 | 3/2009 | Lee et al. |
| 2010/0008177 A1 | 1/2010 | Joo et al. |
| 2010/0054059 A1 | 3/2010 | Yoon et al. |
| 2010/0054073 A1 | 3/2010 | Park |
| 2010/0161933 A1 | 6/2010 | Moon et al. |
| 2011/0050295 A1 | 3/2011 | Kim et al. |
| 2011/0218949 A1 | 9/2011 | Cho et al. |
| 2011/0296068 A1 | 12/2011 | Fredenberg et al. |
| 2011/0296124 A1 | 12/2011 | Fredenberg et al. |
| 2012/0106278 A1 | 5/2012 | Na |
| 2013/0272073 A1 | 10/2013 | Hendrickson |
| 2014/0181452 A1 | 6/2014 | Malladi et al. |
| 2015/0170724 A1 | 6/2015 | Shaeffer et al. |
| 2015/0214172 A1 | 7/2015 | Lin et al. |
| 2016/0062690 A1 | 3/2016 | Shin et al. |
| 2016/0180898 A1 | 6/2016 | Hwang et al. |
| 2016/0180914 A1 | 6/2016 | Kong |
| 2018/0004688 A1 | 1/2018 | Chung et al. |
| 2018/0233184 A1 | 8/2018 | Choi |
| 2018/0373313 A1 | 12/2018 | Hasbun |
| 2019/0004984 A1 | 1/2019 | Lee et al. |
| 2019/0034365 A1 | 1/2019 | Lovelace et al. |
| 2019/0038151 A1 | 2/2019 | Lee et al. |
| 2019/0042120 A1 | 2/2019 | Kajigaya |
| 2019/0079699 A1 | 3/2019 | Lee et al. |
| 2019/0095223 A1 | 3/2019 | Dubel et al. |
| 2019/0130950 A1 | 5/2019 | Kim et al. |
| 2019/0156247 A1 | 5/2019 | Faulhaber, Jr. et al. |
| 2019/0212769 A1 | 7/2019 | Carlough et al. |
| 2019/0280600 A1 | 9/2019 | Rowley |
| 2019/0295658 A1 | 9/2019 | Amaki et al. |
| 2019/0296723 A1 | 9/2019 | Tang et al. |
| 2019/0303310 A1 | 10/2019 | Richter et al. |
| 2019/0310784 A1 | 10/2019 | Kim et al. |
| 2019/0317683 A1 | 10/2019 | Mayer et al. |
| 2019/0318555 A1 | 10/2019 | Hansel et al. |
| 2019/0339881 A1 | 11/2019 | Scott, III |
| 2019/0348095 A1 | 11/2019 | Koh |
| 2019/0355435 A1 | 11/2019 | Liikanen et al. |
| 2019/0362763 A1 | 11/2019 | Lee et al. |
| 2019/0392891 A1 | 12/2019 | Hong |
| 2020/0133505 A1 | 4/2020 | Kim |
| 2020/0133540 A1 | 4/2020 | Pilolli et al. |
| 2020/0133542 A1 | 4/2020 | Kim et al. |
| 2020/0160902 A1 | 5/2020 | Gans |
| 2020/0192791 A1 | 6/2020 | Yang et al. |
| 2020/0211640 A1 | 7/2020 | Sharon et al. |
| 2020/0241984 A1 | 7/2020 | Shim et al. |
| 2020/0264884 A1 | 8/2020 | Jung |
| 2020/0265876 A1 | 8/2020 | Takefman et al. |
| 2020/0372940 A1 | 11/2020 | Park et al. |
| 2020/0372941 A1 | 11/2020 | Park et al. |

FOREIGN PATENT DOCUMENTS

| | | |
|---|---|---|
| KR | 10-2015-0143943 | 12/2015 |
| KR | 10-2016-0041717 | 4/2016 |
| KR | 10-2018-0006654 | 1/2018 |

OTHER PUBLICATIONS

Notice of Allowance issued by the USPTO for U.S. Appl. No. 16/679,582 dated Jan. 12, 2021.

Office Action issued by the USPTO for U.S. Appl. No. 16/727,282 dated Feb. 8, 2021.

Office Action issued by the USPTO for U.S. Appl. No. 16/679,601 dated Mar. 4, 2021.

Notice of Allowance issued by the USPTO for U.S. Appl. No. 16/679,582 dated Apr. 7, 2021.

Notice of Allowance issued by the USPTO for U.S. Appl. No. 16/992,465 dated Apr. 16, 2021.

* cited by examiner

MEMORY SYSTEM CAPABLE OF IMPROVING STABILITY OF A DATA READ OPERATION OF INTERFACE CIRCUIT, AND METHOD OF OPERATING THE MEMORY SYSTEM

CROSS-REFERENCE TO RELATED APPLICATION

The present application claims priority under 35 U.S.C. § 119(a) to Korean patent application number 10-2019-0047421 filed on Apr. 23, 2019, which is incorporated herein by reference in its entirety.

BACKGROUND

Field of Invention

The present invention disclosure relates to an electronic device, and, more particularly, to a memory system and a method of operating the memory system.

Description of Related Art

Recently, the paradigm for a computer environment has been transformed into ubiquitous computing, which enables a computer system to be used at anytime and anywhere. Therefore, use of portable electronic devices such as a mobile phone, a digital camera, and a notebook computer is rapidly increasing. Such portable electronic devices generally use a memory system that employs a memory device for storing data, i.e., as a data storage device. The memory system may be used as a main storage device or an auxiliary storage device of a portable electronic device.

Memory systems used as data storage devices have advantages over traditional data storage devices including improved stability and durability, faster access speeds of information, and lower power consumption partly at least partly because memory systems have no mechanical drivers. Examples memory systems having such advantages, may include a universal serial bus (USB), a memory card having various interfaces, a solid state drive (SSD), and the like.

A memory system may employ volatile and/or nonvolatile memory devices.

A writing speed and a reading speed of a nonvolatile memory device are relatively slow, however, the nonvolatile memory device maintains storage data even though a power supply is shut off. Therefore, a nonvolatile memory device may be used to store data to be maintained regardless of the power supply. Examples of a nonvolatile memory device include a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory may be a NOR or a NAND type.

SUMMARY

The present invention is generally directed to a memory system and a method of operating the memory system capable of improving the stability of read data.

According to an embodiment of the present invention disclosure a memory system and a method of operating the memory system are provided which are capable of improving the stability of read data by employing an interface circuit for data communication between a memory controller and a semiconductor memory.

A memory system according to an embodiment of the present invention disclosure includes a memory device including an interface circuit, the interface circuit storing first system data, and a semiconductor memory; and a controller configured to output a read enable signal and a first read command for the first system data to the memory device. The semiconductor memory transfers a data strobe signal to the interface circuit in response to the read enable signal, the interface circuit reads the first system data in response to the first read command and transmits the read first system data to the controller in synchronization with the data strobe signal.

A memory system according to an embodiment of the present invention disclosure includes a controller configured to receive a host command from a host, and output a command and a read enable signal in response to the received host command; an interface circuit configured to receive the command and the read enable signal from the controller, retime the command and the read enable signal, and output the command and the read enable signal; and a memory device configured to read first data in response to the command and the read enable signal received through the interface circuit and output the read first data to the interface circuit together with the data strobe signal. When the command corresponds to a read operation of second data stored in the interface circuit, the interface circuit transmits the second data in synchronization with the data strobe signal received from the memory device in response to the command.

A method of operating a memory system according to an embodiment of the present invention disclosure includes providing an interface circuit connected between a controller and a semiconductor memory, the interface circuit being configured to mediate data communication between the controller and the semiconductor memory; transmitting, by the controller, a read enable signal and a command to the interface circuit; determining, by the interface circuit, whether the command corresponds to the semiconductor memory or the interface circuit; transmitting, by the interface circuit, the read enable signal and the command to the semiconductor memory; transmitting, by the semiconductor memory, a data strobe signal and first data stored in the semiconductor memory to the controller through the interface circuit respectively in response to the read enable signal and the command when the command corresponds to the semiconductor memory; and transmitting, by the interface circuit, second data stored in the interface circuit to the controller in synchronization with the data strobe signal received from the semiconductor memory in response to the command when the command corresponds to the interface circuit.

A method of operating an interface circuit configured to transfer a signal between a controller and a memory device according to an embodiment of the present invention disclosure includes transferring a read enable signal from the controller to the memory device; and providing the controller with system data, which is stored in the interface circuit, in synchronization with a data strobe signal in response to a read command, wherein the data strobe signal is provided from the memory device in response to the read enable signal.

The present technology may improve stability of reading data stored in the interface circuit by transmitting the read data to the controller according to the same latency as reading data stored in the semiconductor memory. The interface circuit transmits the data read therefrom in synchronization with the data strobe signal provided from the semiconductor memory.

These and other advantages and features of the present invention will become better understood by those with ordinary skill in the art to which the present invention belongs to from the following detailed description in conjunction with the following drawings.

DETAILED DESCRIPTION

Figure 1:
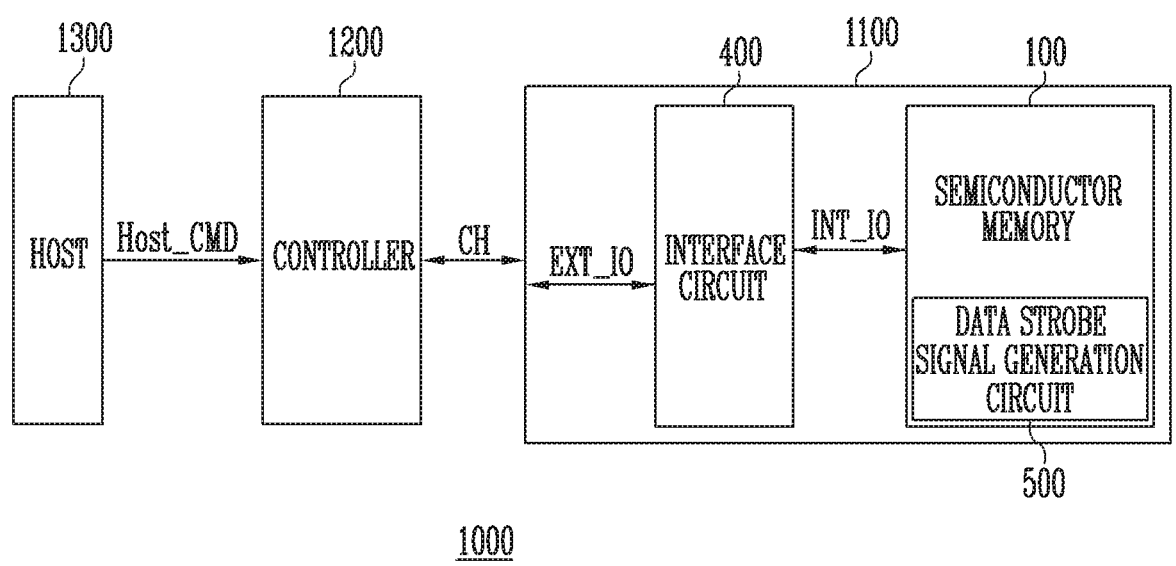
FIG. 1 is a block diagram describing a memory system according to an embodiment of the present invention disclosure.

Specific structural and/or functional descriptions of the described embodiments according to the disclosed concepts of the present invention are illustrated only for facilitating the understanding of the described embodiments according to the disclosed concepts of the present invention disclosure and are not intended to limit the scope of the present invention and the disclosed embodiments. It is therefore understood, that the described embodiments according to the concepts of the present invention disclosure may be carried out by variations of the described embodiments and are not limited to the specific descriptions of the embodiments described herein.

Various modifications and changes may be applied to the described embodiments. The described embodiments according to the concept of the present invention disclosure are not construed as being limited to the specified disclosures, and may include all changes, equivalents, or substitutes that do not depart from the spirit and technical scope of the present invention disclosure.

While terms such as "first" and/or "second" may be used to describe various elements, such elements should not be understood as being limited to the above terms. The above terms may be used to distinguish one element from the other element, for example, a first element may be referred to as a second element without departing from a scope according to the concept of the present invention disclosure and similarly, a second element may be referred to as a first element.

It will be understood that when an element is referred to as being "connected" or "coupled" to another element, it may be directly connected or coupled to the other element or an intervening element may also be present. In contrast, when an element is referred to as being "directly connected" or "directly coupled" to another element, no intervening element is present. Other expressions describing relationships between elements such as "~ between," "immediately ~ between" or "adjacent to ~" and "directly adjacent to ~" may be construed similarly.

The terms used in this specification are merely used to describe specific embodiments, and are not intended to limit the present invention disclosure. Singular forms are intended to include the plural forms as well, unless the context clearly indicates otherwise. In this specification, it should be understood that terms "include" or "have" indicate that a feature, a number, a step, an operation, an element, a part or a combination thereof described in this specification is present, but do not exclude a possibility of presence or addition of one or more other features, numbers, steps, operations, elements, parts, or combinations thereof.

So far as not being differently defined, all terms used herein including technical or scientific terminologies have meanings that are commonly understood by those skilled in the art to which the present invention disclosure pertains in view of the present disclosure. The terms defined in generally used dictionaries should be construed as having the same meanings as would be construed in the context of the related art, and unless clearly defined otherwise in this specification, should not be construed as having idealistic or overly formal meanings.

In describing the embodiments, description of technical contents which are well known in the technical field of the present invention disclosure and are not directly related to the present invention disclosure will be omitted. The omission of unnecessary description is done in order to avoid obfuscating the disclosure of the present invention with well-known details.

Hereinafter, embodiments of the present invention disclosure will be described in detail with reference to the accompanying drawings, so that those skilled in the art may easily carry out the various embodiments of the disclosed invention within the scope and technical spirit of the present invention.

FIG. 1 is a block diagram describing a memory system 1000 according to an embodiment of the present invention disclosure.

Referring to FIG. 1, the memory system 1000 may include a memory device 1100 in which data is stored, and a controller 1200 that controls the memory device 1100. The memory system may also include a host 1300 coupled to the controller 1200. The host 1300 may control the operation of the controller 1200.

The host 1300 may communicate with the controller 1200 by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 1300 and the controller 1200 is not limited to the above-described example, and may be one of other interface protocols such as a universal serial bus (USB), a multi-media card (MMC), an enhanced small disk interface (ESDI), and integrated drive electronics (IDE).

The controller 1200 may generally control an operation of the memory device 1100 and control a data exchange between the host 1300 and the memory device 1100. For example, the controller 1200 may control the memory device 1100 according to a request of the host 1300 to program or read data. The controller 1200 may control the memory device 1100 to read system data of a semiconductor memory 100 included in the memory device 1100 according to the request of the host 1300. The controller 1200 may control the memory device 1100 to perform a read operation of system data stored in an interface circuit 400 of the memory device 1100. The system data of the semiconductor memory 100 may be status data, read training data, option parameter data, and the like of the semiconductor memory. The system data stored in the interface circuit 400 may be status data, read training data, option parameter data, and the like of the interface circuit 400. In order to control performance of the read operation of the system data stored in the semiconductor memory 100 or the interface circuit 400, the controller 1200 may generate a specific command. The specific command may be configured of a command, an address, and data. The address included in the specific command may be an address corresponding to the semiconductor memory 100 or an address corresponding to the interface circuit 400. That is, the memory device 1100 may perform the read operation of the system data stored in the semiconductor memory 100 or the read operation of the system data stored in the interface circuit 400 according to the address included in the specific command.

The memory device 1100 may include the semiconductor memory 100 and the interface circuit 400. The memory device 1100 may be connected to the controller 1200 through a channel CH. The semiconductor memory 100 may communicate with the controller 1200 through the interface circuit 400. For example, the interface circuit 400 may mediate command and data communication between the controller 1200 and the semiconductor memory 100. In addition, the interface circuit 400 may perform a retiming operation on the command and the data exchanged between the controller 1200 and the semiconductor memory 100. The retiming operation may include buffering for storing and outputting the data or the command to be transmitted. When the data or the command to be transmitted is first stored and then transmitted as an output, an output timing of the data or the command to be transmitted can be rearranged to reduce skew. That is, the interface circuit 400 may improve reliability of the memory system 1000 by correcting the output timing of the data and the command exchanged between the controller 1200 and the semiconductor memory 100. The interface circuit 400 may be connected to the channel CH through an external input/output line EXT_IO and may be connected to the semiconductor memory 100 through an internal input/output line INT_IO.

The interface circuit 400 may be selected by the specific command received from the controller 1200 to perform the read operation of the system data stored in the interface circuit 400. The interface circuit 400 may output the read system data to the controller 1200 in synchronization with a data strobe signal generated in the semiconductor memory 100.

The semiconductor memory 100 may include a data strobe signal generation circuit 500 that generates the data strobe signal for synchronizing read data with a plurality of memory cells capable of storing normal data and the system data, and outputting the read data during a data read operation. The data strobe signal generation circuit 500 may generate the data strobe signal for synchronously outputting the read data during the read operation of the normal data and the system data stored in the semiconductor memory 100, and the read operation of the system data stored in the interface circuit 400.

According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

Figure 2:
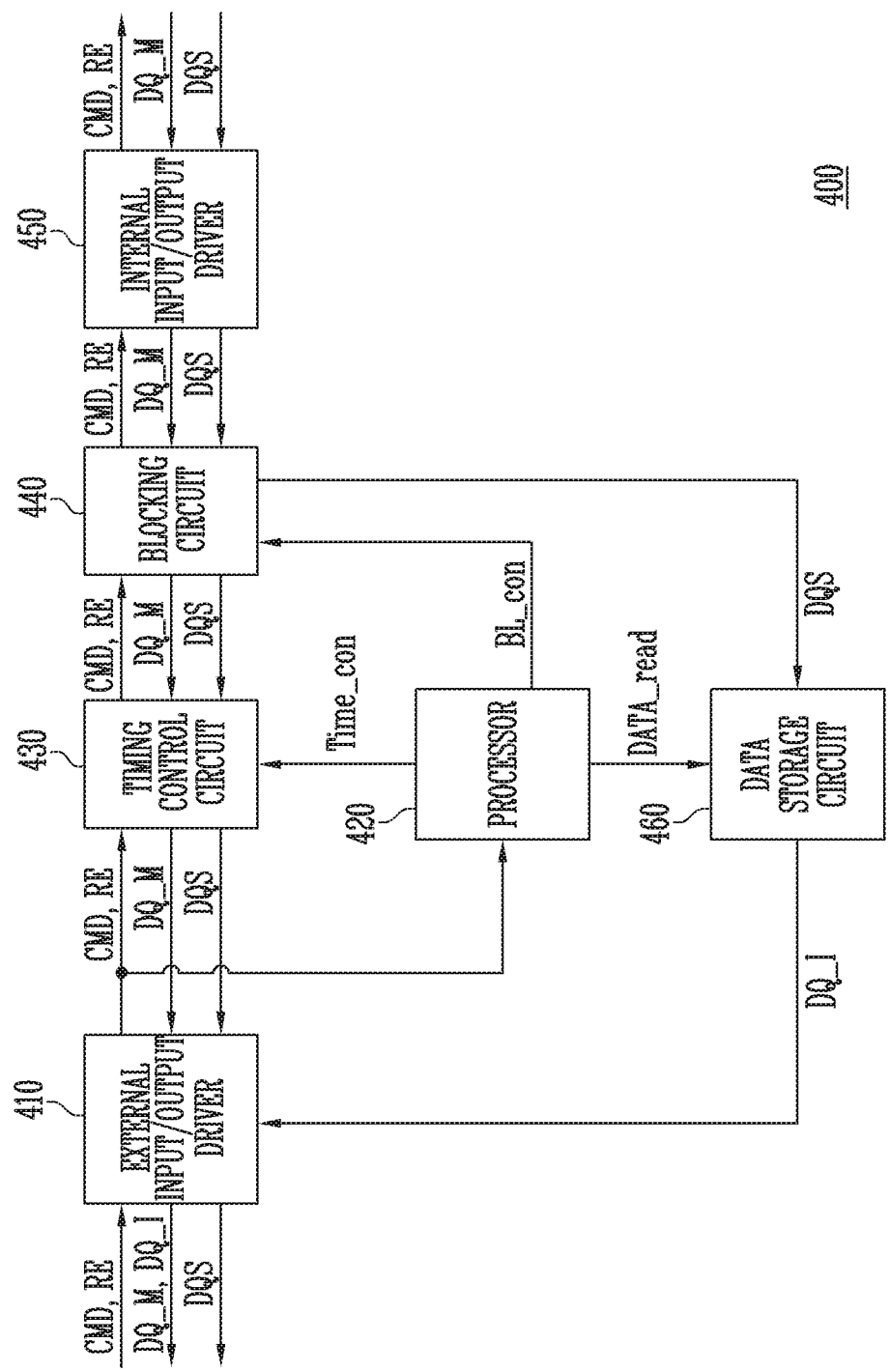
FIG. 2 is a block diagram describing a configuration of an interface circuit employed in the memory system of FIG. 1 according to an embodiment of the present invention disclosure.

FIG. 2 is a block diagram describing a configuration of the interface circuit 400.

Referring to FIG. 2, the interface circuit 400 may include an external input/output driver 410, a processor 420, a timing control circuit 430, a blocking circuit 440, an internal input/output driver 450, and a data storage circuit 460.

The external input/output driver 410 receives a command CMD and a read enable signal RE from the controller 1200 and transmits the command CMD and the read enable signal RE to the processor 420 and the timing control circuit 430.

In addition, the external input/output driver 410 receives data DQ_M and a data strobe signal DQS from the timing control circuit 430 and transmits the data DQ_M and the data strobe signal DQS to the controller 1200. Alternatively, the external input/output driver 410 receives the data strobe signal DQS from the timing control circuit 430, receives data DQ_I from the data storage circuit 460, and transmits the data strobe signal DQS and the data DQ_I to the controller 1200.

The processor 420 receives the command CMD from the external input/output driver 410 and parses the received command CMD. The processor 420 determines whether an address included in the command CMD corresponds to the semiconductor memory 100 or the interface circuit 400 during a parsing operation.

As a result of the parsing, when the command CMD is a command CMD to be transmitted to the semiconductor memory 100, the processor 420 generates and outputs a timing control signal Time_con corresponding to the command CMD. The command may correspond to an operation such as, for example, a program operation, a read operation, a system data read operation and the like.

When, as a result of the parsing, the processor 420 determines that the received command CMD corresponds to the read operation of the system data stored in the data storage circuit 460 in the interface circuit 400, the processor 420 activates a data read signal DATA_read and outputs the data read signal DATA_read to the data storage circuit 460. In addition, as a result of the parsing, when the received command CMD corresponds to the read operation of the system data stored in the data storage circuit 460, the processor 420 generates a blocking control signal BL_con to control the blocking circuit 440 to block the data DQ_M received through the internal input/output driver 450 from the semiconductor memory 100.

The timing control circuit 430 receives the command CMD and the read enable signal RE from the external input/output driver 410, controls and rearranges a timing of the received command CMD and read enable signal RE in response to the timing control signal Time_con received from the processor 420, and outputs the command CMD and the read enable signal RE to the blocking circuit 440.

The blocking circuit 440 receives the command CMD and the read enable signal RE output from the timing control circuit 430 and transmits the command CMD and the read enable signal RE to the internal input/output driver 450.

In addition, the blocking circuit 440 may receive the blocking control signal Block_con from the processor 420 and block the data DQ_M among the data DQ_M and the data strobe signal DQS received through the internal input/output driver 450. As a result, the received data strobe signal DQS may be transmitted to the data storage circuit 460 and the timing control circuit 430.

For example, the blocking circuit 440 transmits to the timing control circuit 430 the data DQ_M and the data strobe signal DQS received through the internal input/output driver 450 without a blocking operation during the normal read operation and the system data read operation of the semiconductor memory 100. The blocking circuit 440 blocks the data DQ_M among the data DQ_M and the data strobe signal DQS received through the internal input/output driver 450 during the system data read operation of the interface circuit 400, and outputs the data strobe signal DQS to the timing control circuit 430 and the data storage circuit 460.

The internal input/output driver 450 receives the command CMD and the read enable signal RE through the blocking circuit 440 and transmits the command CMD and the read enable signal RE to the semiconductor memory 100. The internal input/output driver 450 receives the data DQ_M and the data strobe signal DQS from the semiconductor memory 100 and transmits the data DQ_M and the data strobe signal DQS to the blocking circuit 440.

The data storage circuit 460 stores the system data of the interface circuit 400. The system data may be the status data, the read training data, the option parameter data, and the like of the interface circuit 400. The data storage circuit 460 performs the read operation of the system data in response to the data read signal DATA_read received from the processor 420 and outputs the read data DQ_I to the external input/output driver 410 in synchronization with the data strobe signal DQS received from the blocking circuit 440.

Figure 3:
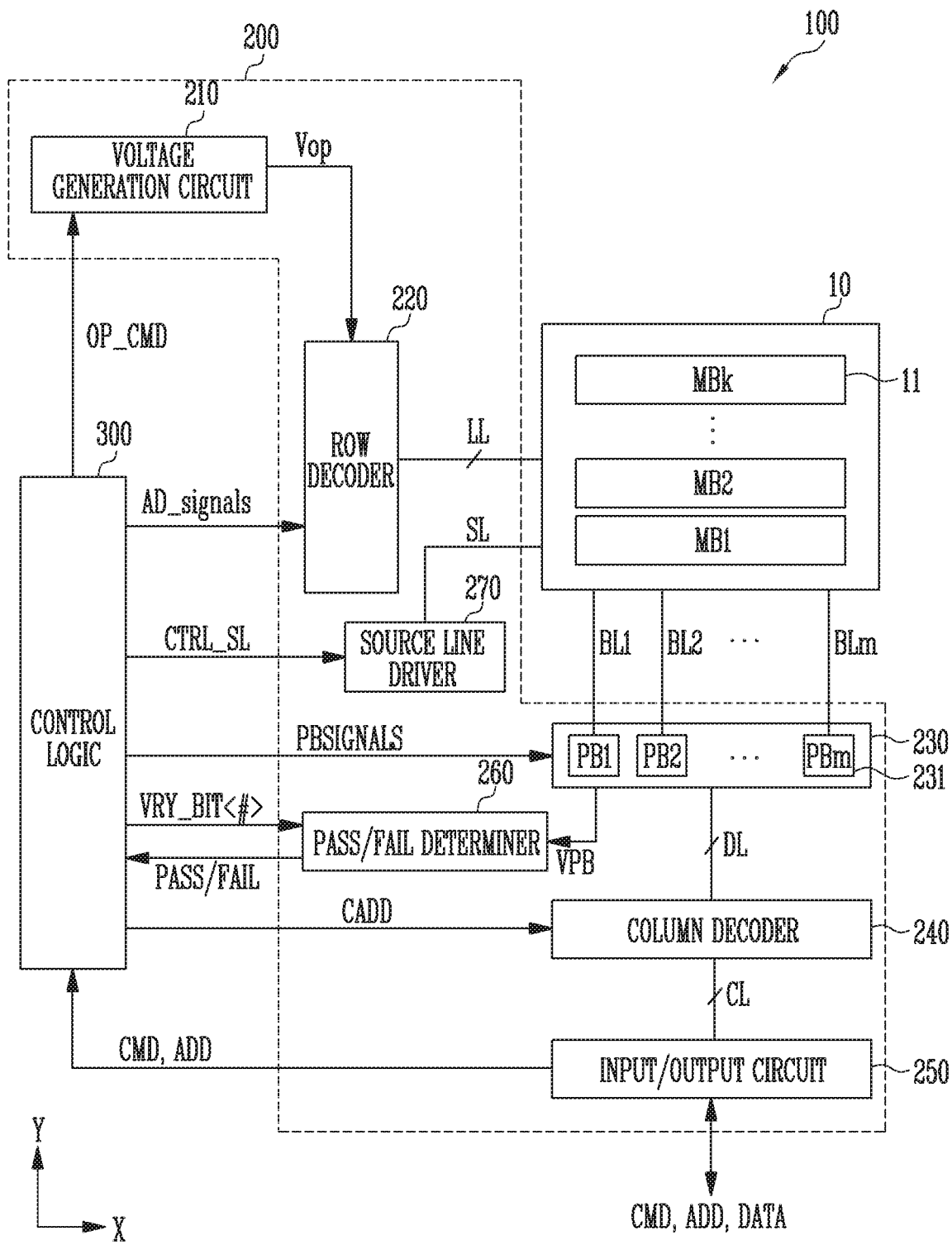
FIG. 3 is a diagram describing an exemplary configuration of a semiconductor memory of the memory system of FIG. 1.

FIG. 3 is a diagram describing the semiconductor memory 100 of FIG.

Referring to FIG. 3, the semiconductor memory 100 may include a memory cell array 10 in which data is stored. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 that controls the peripheral circuits 200 according to the command that is generated in the controller 1200 and received through the interface circuit 400.

The memory cell array 10 may include a plurality of memory blocks MB1 to MBk and 11 (k is a positive integer). Some memory blocks (for example, MB1) of the plurality of memory blocks 11 may store the system data, and the remaining memory blocks MB2 to MBk may store the normal data. Local lines LL and bit lines BL1 to BLm (m is a positive integer) may be connected to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk 11, respectively, and the bit lines BL1 to BLm may be commonly connected to the memory blocks MB1 to MBk 11. The memory blocks MB1 to MBk 11 may be implemented in a two-dimensional or three-dimensional structure. For example, the memory cells may be arranged in a direction parallel to a substrate in the memory block 11 of the two-dimensional structure. For example, the memory cells may be stacked in a direction perpendicular to the substrate in the memory block 11 of the three-dimensional structure.

The peripheral circuits 200 may be configured to perform the program, read, and erase operations of the memory block 11 selected under control of the control logic 300. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a pass voltage, and a select transistor operation voltage under the control of the control logic 300.

The row decoder 220 may transmit the operation voltages Vop to the local lines LL connected to the selected memory block 11 in response to a row decoder control signals AD_signals1 and AD_signals2. For example, the row decoder 220 may selectively apply the operation voltages (for example, the program voltage, the verify voltage, the pass voltage, and the like) generated in the voltage generation circuit 210 in response to the row decoder control signals AD_signals to the word lines among the local lines LL.

The row decoder 220 applies the program voltage generated in the voltage generation circuit 210 to the selected word line among the local lines LL and applies the pass voltage generated in the voltage generation circuit 210 to the remaining unselected word lines, in response to the row decoder control signals AD_signals during a program voltage application operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during a read operation.

The page buffer group 230 may include a plurality of page buffers PB1 to PBm 231 connected to the bit lines BL1 to BLm. The page buffers PB1 to PBm 231 may operate in response to page buffer control signals PBSIGNALS. For example, the page buffers PB1 to PBm 231 may temporarily store data to be programmed during a program operation or sense a voltage or a current of the bit lines BL1 to BLm during the read operation or the verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and the address ADD received from the controller 1200 to the control logic 300 or may exchange the data with the column decoder 240.

The pass/fail determiner 260 may generate a reference current in response to a permission bit VRY_BIT<#> during the read operation or the verify operation, compare a sensing voltage VPB received from the page buffer group 230 with a reference voltage generated by the reference current, and output a pass signal PASS or a fail signal FAIL.

The source line driver 270 may be connected to the memory cell included in the memory cell array 10 through a source line SL and may control a voltage applied to the source line SL. The source line driver 270 may receive a source line control signal CTRL_SL from the control logic 300 and may control a source line voltage applied to the source line SL based on the source line control signal CTRL_SL.

The control logic 300 may output the operation signal OP_CMD, the row decoder control signal AD_signals, the page buffer control signals PBSIGNALS, and the permission bit VRY_BIT<#> in response to the command CMD and the address ADD to control the peripheral circuits 200. In addition, the control logic 300 may determine whether the verify operation has passed or failed in response to the pass signal PASS or the fail signal FAIL.

Figure 4:
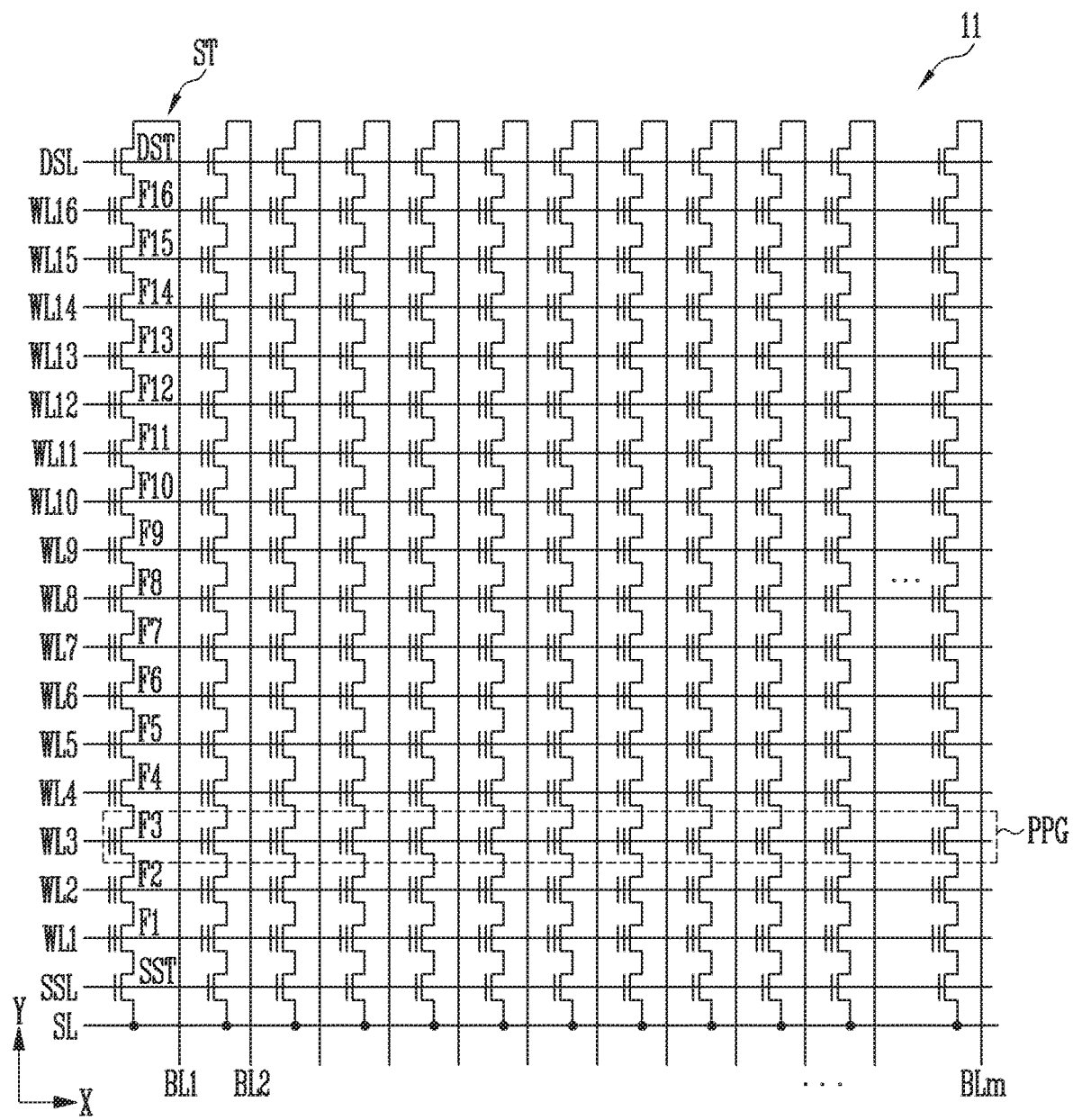
FIG. 4 is a diagram describing an exemplary two-dimensional configuration of a memory block of the semiconductor memory of FIG. 3.

FIG. 4 is a diagram describing the memory block of FIG. 3.

Referring to FIG. 4, the memory block 11 may be connected to the plurality of word lines arranged in parallel with each other between the first select line and the second select line. Here, the first select line may be a source select line SSL, and the second select line may be a drain select line DSL. Specifically, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be described in detail, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include more memory cells than the number shown in the figure.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 5:
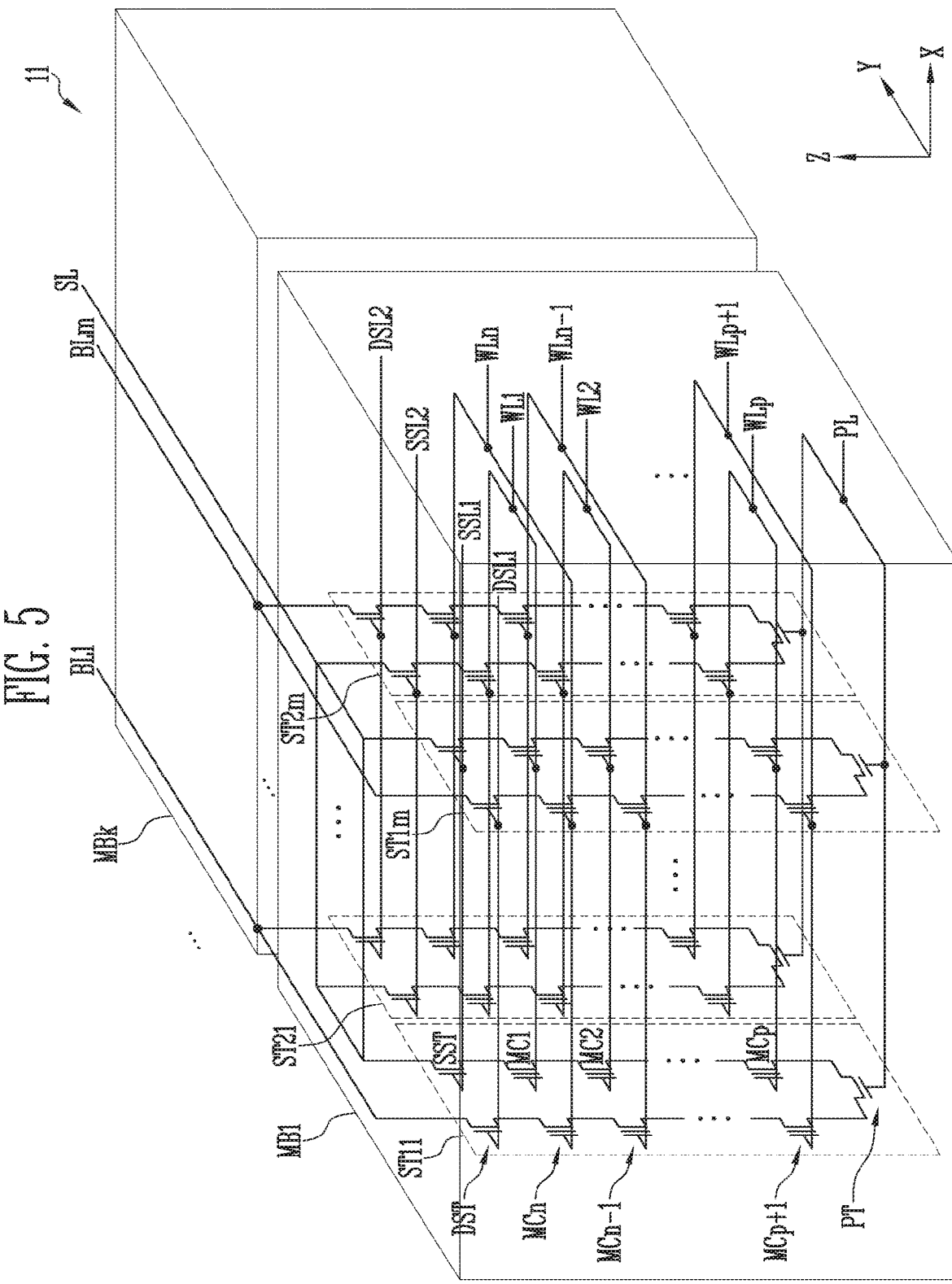
FIG. 5 is a diagram describing an embodiment of a three-dimensional configuration of a memory block of the semiconductor memory of FIG. 3.

FIG. 5 is a diagram describing an embodiment of a memory block configured in three-dimensions.

Referring to FIG. 5, the memory cell array 10 may include a plurality of memory blocks MB1 to MBk. The memory block 11 may include a plurality of strings ST11 to ST1*m* and ST21 to ST2*m*. As an embodiment, each of the plurality of strings ST11 to ST1*m* and ST21 to ST2*m* may be formed in a U shape. In the first memory block MB1, strings may be arranged in a direction (X direction). In FIG. 5, two strings are arranged in a column direction (Y direction), but this is for convenience of description, and three or more strings may be arranged in the column direction (Y direction).

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings arranged in the same row may be connected to the source select line extending in the row direction, and the source select transistors of the strings arranged in different rows may be connected to different source select lines. In FIG. 5, the source select transistors of the strings ST11 to ST1m of a first row may be connected to a first source select line SSL1. The source select transistors of the strings ST21 to ST2m of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to a pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 5, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 of the strings ST11 to ST1m of the first row may configure one page. The memory cells connected to the first word line WL1 of the strings ST21 to ST2m of the second row may configure another page. When one of the drain select lines DSL1 and DSL2 is selected, the strings arranged in one row direction are selected. When one of the word lines WL1 to WLn is selected, one page is selected among the selected strings.

Figure 6:
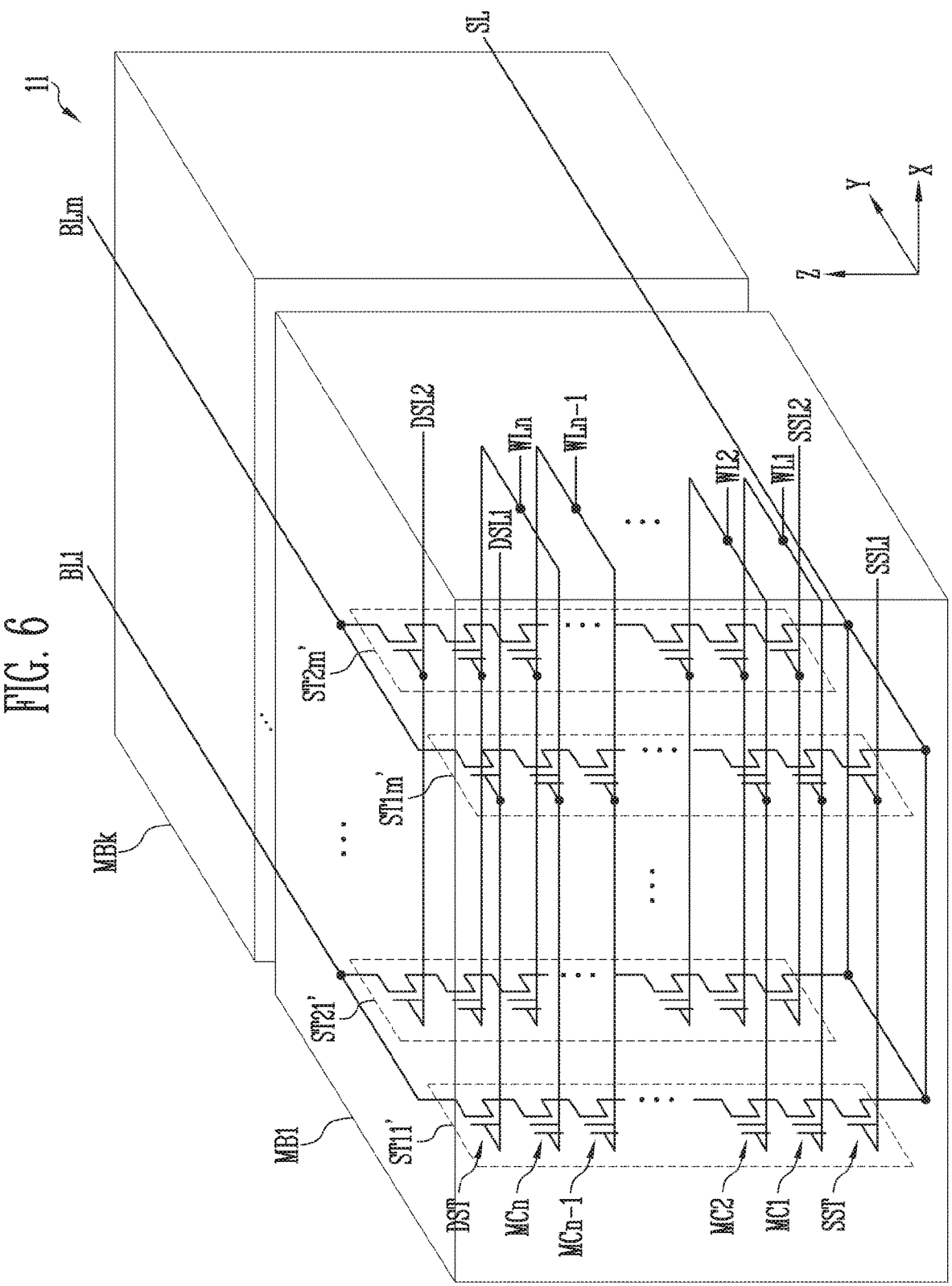
FIG. 6 is a diagram describing another embodiment of a three-dimensional configuration of a memory block of the semiconductor memory of FIG. 3.

FIG. 6 is a diagram describing another embodiment of a memory block configured in three-dimensions.

Referring to FIG. 6, the memory cell array 10 may include a plurality of memory blocks MB1 to MBk. The memory block 11 may include a plurality of strings ST11' to ST1m' and ST21' to ST2m'. Each of the plurality of strings ST11' to ST1m' and ST21' to ST2m' may extend along the vertical direction (Z direction). In the memory block 11, strings may be arranged in the row direction (X direction). In FIG. 6, two strings are arranged in the column direction (Y direction), but this is for convenience of description, and three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to the first source select line SSL1. The source select transistors of the strings ST21' to ST2m' arranged in the second row may be connected to the second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1m' of the first row may be connected to the first drain select line DSL1. The drain select transistors DST of the strings ST21' to ST2m' of the second row may be connected to the second drain select line DSL2.

Figure 7:
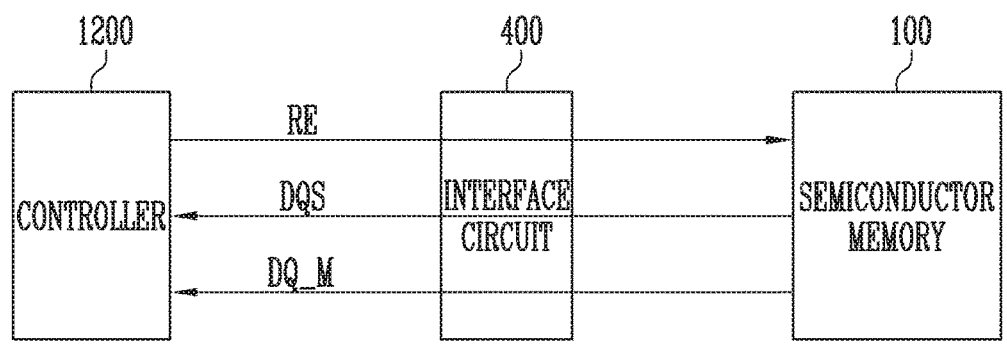
FIG. 7 is a diagram describing a transmission flow of data and signals during a read operation of a semiconductor memory according to an embodiment of the present invention disclosure.

FIG. 7 is a diagram describing a transmission flow of data and signals during a read operation of a semiconductor memory according to an embodiment of the present invention disclosure.

Figure 8:
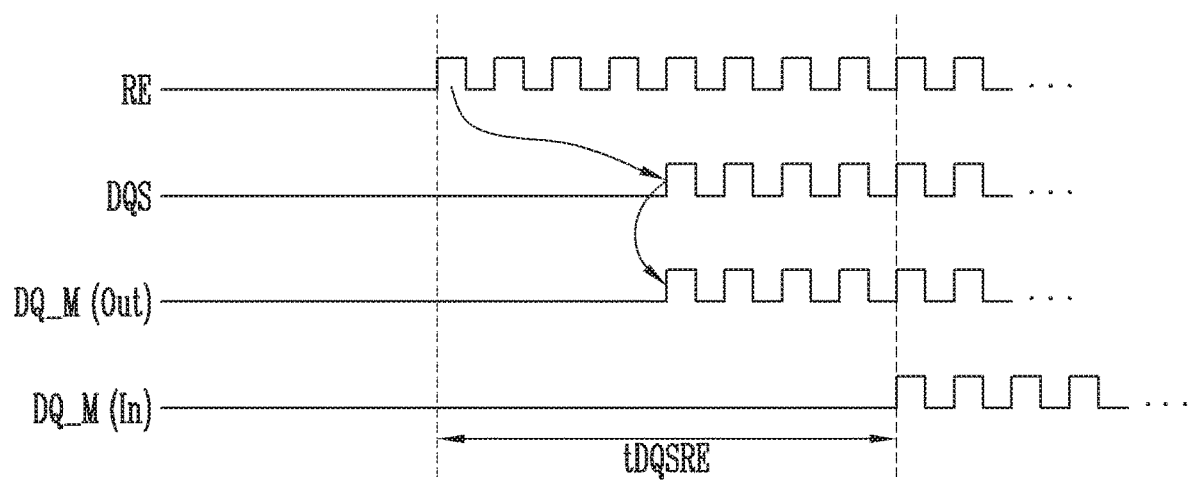
FIG. 8 is a waveform diagram of data and signals which describe a read operation of a semiconductor memory according to an embodiment of the present invention disclosure.

FIG. 8 is a waveform diagram of data and signals describing a read operation of a semiconductor memory according to an embodiment of the present invention disclosure.

The read operation of the normal data or the system data of the semiconductor memory according to the embodiment of the present invention disclosure will be described as follows with reference to FIGS. 7 and 8.

Referring to FIGS. 7 and 8, the controller 1200 generates and outputs the read enable signal RE during a read operation of the normal data or the system data DQ_M stored in the semiconductor memory 100. The read enable signal RE is toggled at a regular period from an activation time point.

The read enable signal RE generated in the controller 1200 is transmitted to the interface circuit 400 and the interface circuit 400 transmits the received read enable signal RE to the semiconductor memory 100. The semiconductor memory 100 generates the data strobe signal DQS in response to the received read enable signal RE.

The semiconductor memory 100 reads the stored normal data or system data DQ_M and outputs the read normal data or system data DQ_M in synchronization with the data strobe signal DQS (DQ_M(Out)). Then, the output normal data or system data DQ_M is received by the controller 1200 through the interface circuit 400 (DQ_M(In)).

A time from a time point at which the read enable signal RE is activated and generated in the controller 1200 to a time point at which the normal data or the system data DQ_M is received by the controller 1200 is defined as a data transmission time tDQSRE of the read operation, and the controller 1200 may perform a preparatory operation for receiving data during the data transmission time tDQSRE. Therefore, the data transmission time tDQSRE may be set to a regular time. When the data transmission time tDQSRE is shorter than the set regular time, a data reception preparation operation of the controller cannot be completed and thus reliability of the received data may be reduced.

Figure 9:
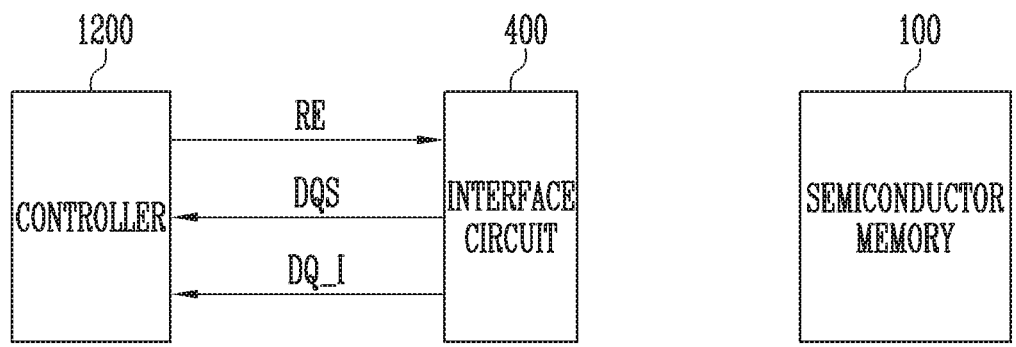
FIG. 9 is a diagram describing a transmission flow of data and signals during a read operation of data stored in an interface circuit.

FIG. 9 is a diagram describing a transmission flow of data and signals during a read operation of data stored in an interface circuit.

Figure 10:
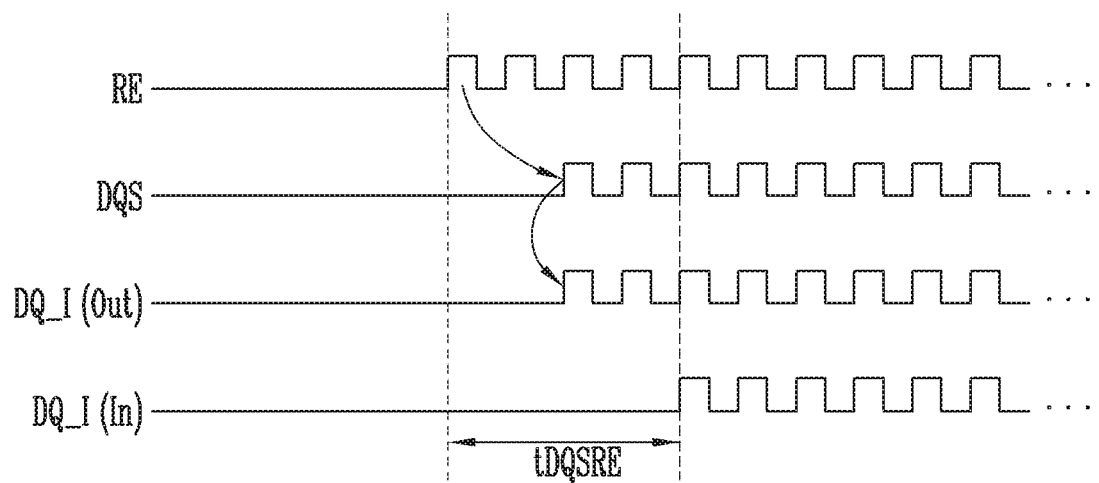
FIG. 10 is a waveform diagram of data and signals describing a read operation of data stored in an interface circuit.

FIG. 10 is a waveform diagram of data and signals describing a read operation of data stored in an interface circuit.

Referring to FIGS. 9 and 10, the controller 1200 generates and outputs the read enable signal RE during a read operation of the system data DQ_I stored in the interface circuit 400. The read enable signal RE is toggled at a regular period from an activation time point.

The read enable signal RE generated in the controller 1200 is transmitted to the interface circuit 400, and the interface circuit 400 generates the data strobe signal DQS in response to the received read enable signal RE.

The interface circuit 400 reads the system data DQ_M stored in the interface circuit 400, and outputs the system data DQ_I in synchronization with the data strobe signal DQS (DQ_I(Out)). The output system data is received by the controller 1200 (DQ_I(In)).

When the interface circuit 400 generates the data strobe signal DQS during the read operation of the system data DQ_I stored in the interface circuit 400, a time point at which the data strobe signal DQS is generated by the interface circuit 400 and a time point at which the read data reaches the controller 1200 are faster than a time point of the read operation of the normal data or the system data of the semiconductor memory 100 shown in FIGS. 7 and 8. Therefore, the data transmission time tDQSRE during the read operation of the system data DQ_I stored in the interface circuit 400 is shorter than the data transmission time tDQSRE during the read operation of the normal data or the system data of the semiconductor memory 100. The shorter data transmission time tDQSRE during the read operation of the system data DQ_I stored in the interface circuit 400 may interrupt completion of the data reception preparation operation of the controller and thus reliability of the read operation of the system data DQ_I stored in the interface circuit 400 may be reduced.

Figure 11:
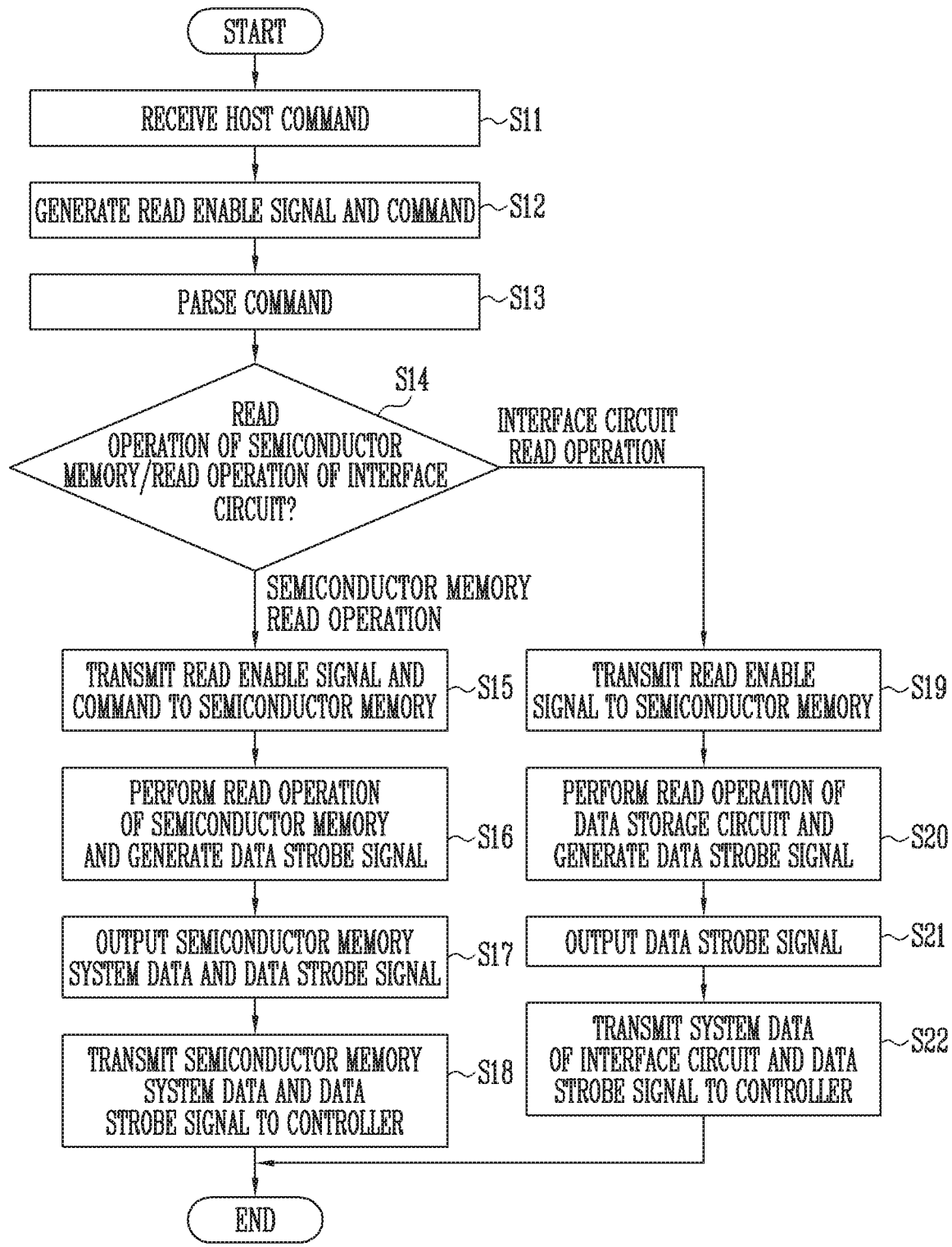
FIG. 11 is a flowchart of a method of operating a memory system according to an embodiment of the present invention disclosure.

FIG. 11 is a flowchart describing a method of operating the memory system 1000 according to an embodiment of the present invention disclosure.

A method of operating the memory system 1000 according to an embodiment of the present invention disclosure will be described as follows with reference to FIGS. 1, 2, and 11.

In the embodiment of the present invention disclosure, the operation of reading the system data stored in the semiconductor memory 100 or the system data stored in the interface circuit 400 will be described as an example.

The host 1300 outputs the specific command for the read operation of the system data stored in the semiconductor memory 100 or the interface circuit 400 as a host command Host_CMD. The controller 1200 receives the host command Host_CMD from the host 1300 (S11), and generates and outputs the command CMD corresponding to the host command Host_CMD and the read enable signal RE for the read operation (S12). At this time, the address included in the command may be an address corresponding to the semiconductor memory 100 or an address corresponding to the interface circuit 400 according to a target of the read operation.

The interface circuit 400 of the memory device 1100 receives the command CMD and the read enable signal RE from the controller 1200, and the processor 420 of the interface circuit 400 parses the received command CMD (S13).

As a result of the parsing of the command CMD by the processor 420 (S14), when it is determined that the received command CMD corresponds to the read operation of the semiconductor memory 100, the interface circuit 400 controls and rearranges the timing of the received command CMD and read enable signal RE, and transmits the command CMD and the read enable signal RE to the semiconductor memory 100 (S15).

The semiconductor memory 100 performs the read operation of the system data in response to the received command CMD, and the data strobe signal generation circuit 500 of the semiconductor memory 100 generates the data strobe signal DQS in response to the read enable signal RE (S16).

The semiconductor memory 100 outputs the read system data DQ_M to the interface circuit 400 together with the data strobe signal DQS in synchronization with the data strobe signal DQS (S17).

The interface circuit 400 receives the system data DQ_M and the data strobe signal DQS from the semiconductor memory 100, controls and rearranges the timing of the received system data DQ_M and data strobe signal DQS, and then transmits the system data DQ_M and the data strobe signal DQS to the controller 1200 (S18).

As result of the parsing of the command CMD by the processor 420 described above (S14), when it is determined that the received command CMD corresponds to the read operation of the interface circuit 400, the interface circuit 400 controls and rearranges the timing of the read enable signal RE, and transmits the read enable signal RE to the semiconductor memory 100 (S19). At this time, the received command CMD may also be transmitted to the semiconductor memory 100 together with the read enable signal RE.

The processor 420 of the interface circuit 400 activates the data read signal DATA_read according to the parsing result of the command CMD and outputs the data read signal DATA_read to the data storage circuit 460. The data storage circuit 460 reads the system data DQ_I of the interface circuit 400 in response to the data read signal DATA_read, and the data strobe signal generation circuit 500 of the semiconductor memory 100 generates the data strobe signal DQS in response to the read enable signal RE (S20). At this time, the semiconductor memory 100 may perform the read operation of the system data DQ_M of the semiconductor memory 100 in response to the command CMD received together with the read enable signal RE.

The semiconductor memory 100 outputs the read system data DQ_M to the interface circuit 400 together with the data strobe signal DQS in synchronization with the data strobe signal DQS (S21).

The interface circuit 400 receives the data strobe signal DQS from the semiconductor memory 100 and outputs the system data DQ_I to the controller 1200 in synchronization with the received data strobe signal DQS. At this time, the interface circuit 400 may transmit the system data DQ_I and the data strobe signal DQS together to the controller 1200 (S22). In addition, the interface circuit 400 blocks the system data DQ_M of the semiconductor memory 100 received from the semiconductor memory 100.

Figure 12:
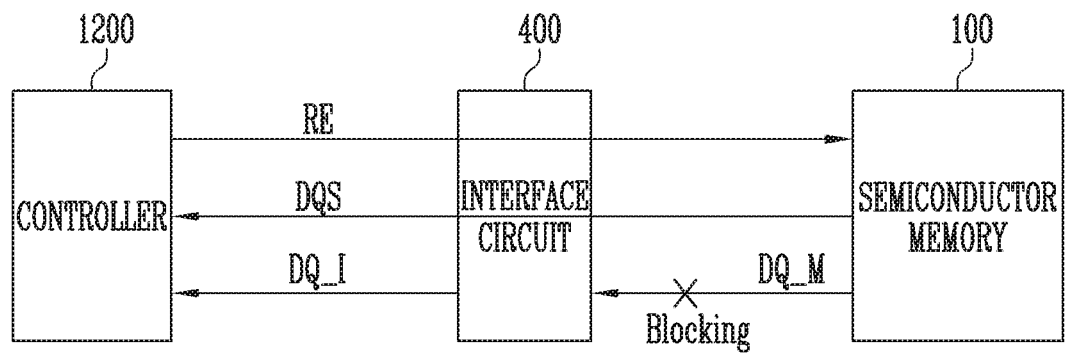
FIG. 12 is a diagram describing a transmission flow of data and signals during a read operation of data stored in an interface circuit according to an embodiment of the present invention disclosure.

FIG. 12 is a diagram describing a transmission flow of data and signals during a read operation of data stored in an interface circuit according to an embodiment of the present invention disclosure.

Figure 13:
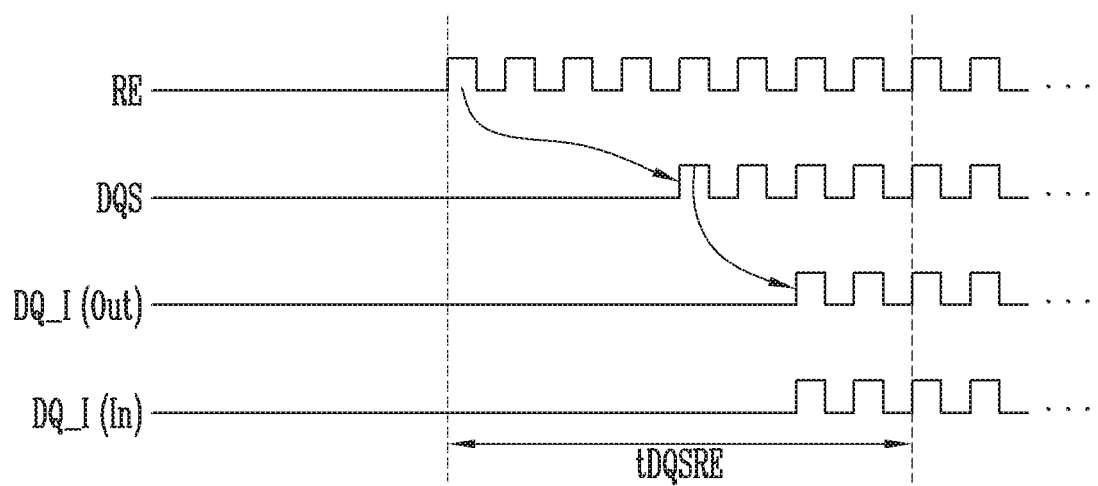
FIG. 13 is a waveform diagram of data and signals describing a read operation of data stored in an interface circuit according to an embodiment of the present invention disclosure.

FIG. 13 is a waveform diagram of data and signals describing a read operation of data stored in an interface circuit according to an embodiment of the present invention disclosure.

Referring to FIGS. 12 and 13, the controller 1200 generates and outputs the read enable signal RE during the read operation of the system data DQ_I stored in the interface circuit 400. The read enable signal RE is toggled at a regular period from an activation time point.

The read enable signal RE generated in the controller 1200 is transmitted to the interface circuit 400, and the interface circuit 400 transmits the received read enable signal RE to the semiconductor memory 100. The semiconductor memory 100 generates the data strobe signal DQS in response to the received read enable signal RE.

The semiconductor memory 100 transmits the data strobe signal DQS to the interface circuit 400, and the interface circuit 400 outputs the system data DQ_I of the interface circuit 400 to the controller 1200 in synchronization with the data strobe signal DQS received from the semiconductor memory 100. The interface circuit 400 may block the system data of the semiconductor memory 100 received from the semiconductor memory 100 together with the data strobe signal DQS.

As described above, during the read operation of the system data of the interface circuit 400, the read enable signal RE generated in the controller 1200 is transmitted to the semiconductor memory 100 and the system data of the interface circuit 400 is transmitted to the controller 1200 using the data strobe signal DQS generated in the semiconductor memory 100. Therefore, the data transmission time tDQSRE of the read operation of the system data of the interface circuit 400 may be the same as the data transmission time tDQSRE of the read operation of the data of the semiconductor memory 100 shown in FIG. 8. Thus, the same data transmission time tDQSRE may prevent an interruption to the completion of the data reception preparation operation of the controller and reliability of the read operation of the system data of the interface circuit 400 may be improved.

Figure 14:
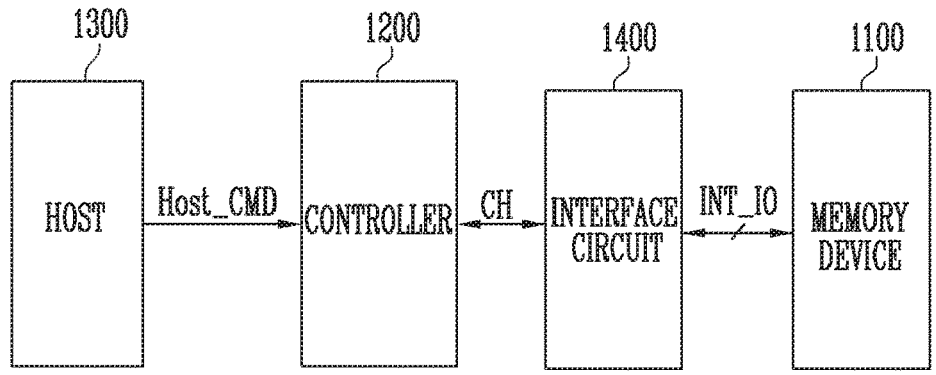
FIG. 14 is a diagram describing another embodiment of the memory system.

FIG. 14 is a diagram describing another embodiment of the memory system.

Referring to FIG. 14, a memory system 1000 includes a memory device 1100 in which data is stored, a controller 1200 that controls the memory device 1100 under control of a host 1300, and an interface circuit 1400 that mediates command and data transmission between the controller 1200 and the memory device 1100.

Differently from the memory system 1000 shown in FIG. 1, in the memory system 1000 shown in FIG. 14, the interface circuit 1400 may be disposed outside the memory device 1100 and may transmit the command and data through the memory device 1100 and an internal input/output line INT_IO.

The controller 1200 may generally control an operation of the memory system 1000 and control a data exchange between the host 1300 and the memory device 1100. The controller 1200 may control a plurality of semiconductor memories included in the memory device 1100 to program or read data according to a request of the host 1300. In addition, the controller 1200 may control the interface circuit 1400 to perform a read operation of data stored in the interface circuit 1400 according to the request of the host 1300, and may transmit the data stored in the interface circuit 1400 to the controller 1200 using a data strobe signal generated in the memory device 1100 based on a read enable signal during a read operation of the data stored in the interface circuit 1400.

A configuration of the interface circuit 1400 may be configured and operated as in the configuration of FIG. 2 described above.

Figure 15:
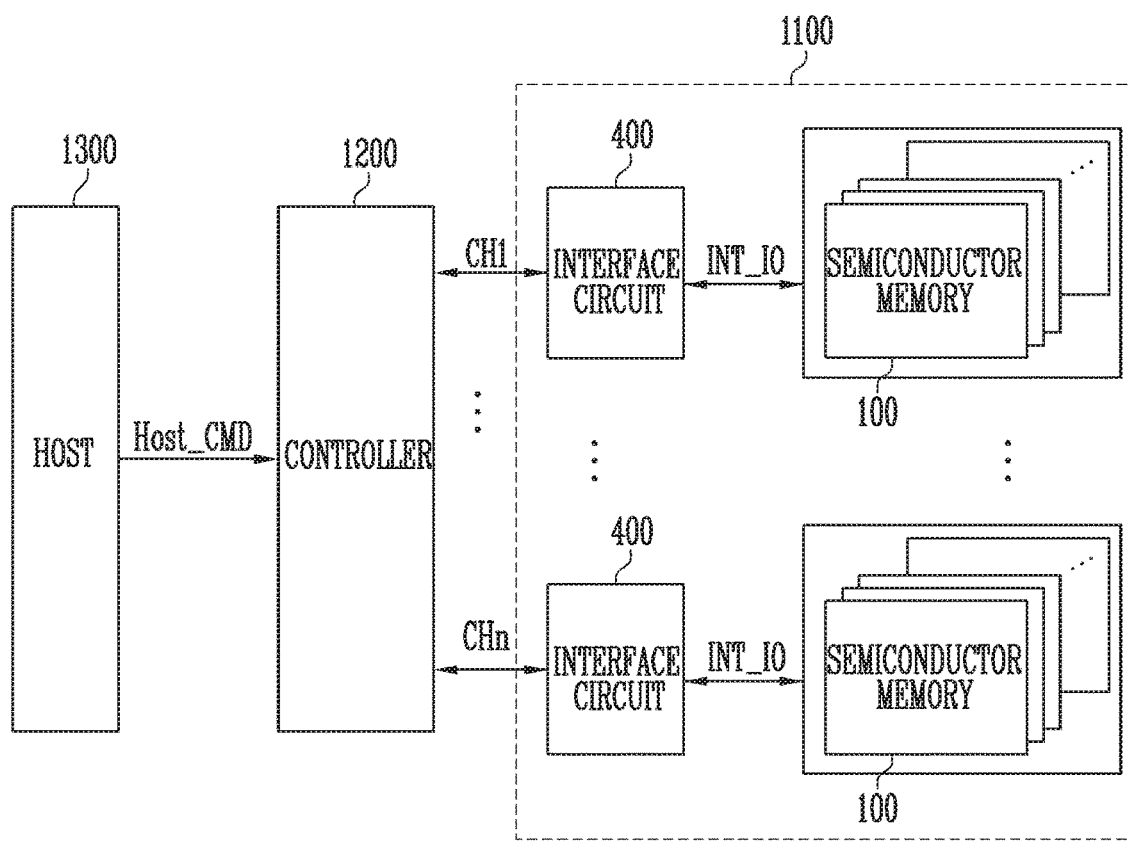
FIG. 15 is a diagram describing another embodiment of the memory system.

FIG. 15 is a diagram describing another embodiment of the memory system.

Referring to FIG. 15, a memory system 1000 includes a memory device 1100 and a controller 1200. The memory device 1100 includes a plurality of semiconductor memories 100 and a plurality of interface circuits 400. The plurality of semiconductor memories 100 may be divided into a plurality of groups, and each of the plurality of groups may be connected to one interface circuit 400 through an internal input/output line INT_IO.

In FIG. 15, a plurality of interface circuits 400 communicate with the controller 1200 through first to n-th channels CH1 to CHn, respectively. Therefore, the plurality of semiconductor memories 100 included in one group are configured to communicate with the controller 1200 through one interface circuit 400 and a common channel. The controller 1200 is configured to control the plurality of semiconductor memories 100 of the memory device 1100 through the plurality of channels CH1 to CHn.

The controller 1200 may generally control an operation of the memory system 1000 and control a data exchange between the host 1300 and the memory device 1100. The controller 1200 may control the plurality of semiconductor memories 100 included in the memory device 1100 to program or read data according to a request of the host 1300. In addition, the controller 1200 may control the interface circuits 400 to perform a read operation of data stored in the interface circuit 400 according to the request of the host 1300, and may transmit the data stored in the interface circuits 400 to the controller 1200 using a data strobe signal generated in the memory device 1100 based on a read enable signal during a read operation of the data stored in the interface circuits 1400.

A configuration of the interface circuit 400 may be configured and operated as in the configuration of FIG. 2 described above.

The controller 1200 and the memory device 1100 may be integrated into one semiconductor device. As an exemplary embodiment, the controller 1200 and the memory device 1100 may be integrated into one semiconductor device to form a memory card. For example, the controller 1200 and the memory device 1100 may be integrated into one semiconductor device to form a memory card such as a PC card (personal computer memory card international association (PCMCIA)), a compact flash card (CF), a smart media card (SM, SMC), a memory stick, a multimedia card (MMC, RS-MMC, MMCmicro), an SD card (SD, miniSD, microSD, SDHC), and a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host 1300 connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring telematics network, an RFID device, or one of various components configuring a computing system.

As an exemplary embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flatpack (TQFP), a small outline (SOIC), a shrink small outline package (SSCP), a thin small outline (TSOP), a thin quad flatpack (TQFP), a system in package (SIP), a multi-chip package (MCP), or a wafer-level fabricated package processed stack package (WSP).

Figure 16:
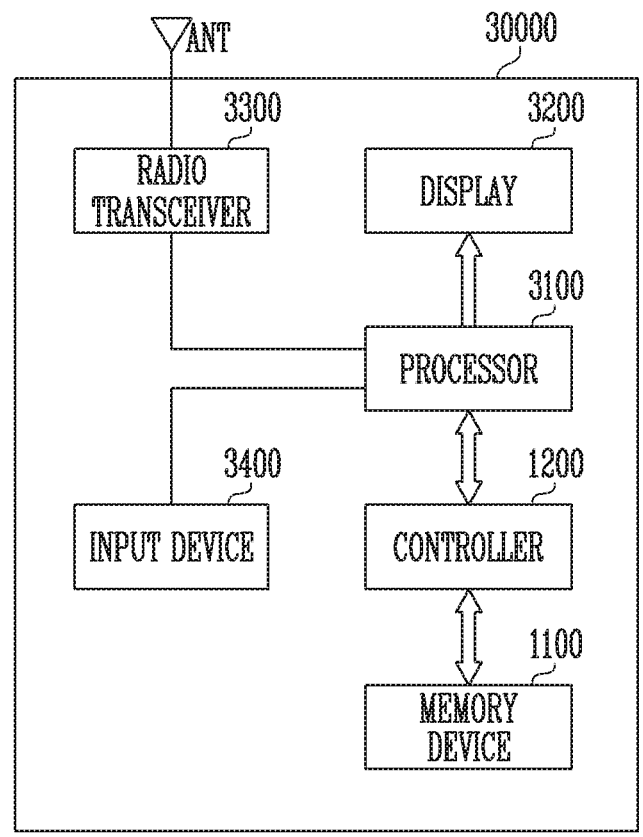
FIG. 16 is a diagram describing another embodiment of the memory system.

FIG. 16 is a diagram describing another embodiment of the memory system.

Referring to FIG. 16, a memory system 30000 may be implemented as a cellular phone, a smartphone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive radio signals through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad, a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100. In addition, the memory device 1100 may include the interface circuit 400, such as the memory device 1100 shown in FIG. 1 or the memory device 1100 shown in FIG. 15. In addition, when the memory device 1100 includes only a semiconductor memory as shown in FIG. 14, an interface circuit for data communication between the controller 1200 and the memory device 1100 may be additionally provided. At this time, the interface circuit may be configured as the interface circuit 400 of FIG. 2.

Figure 17:
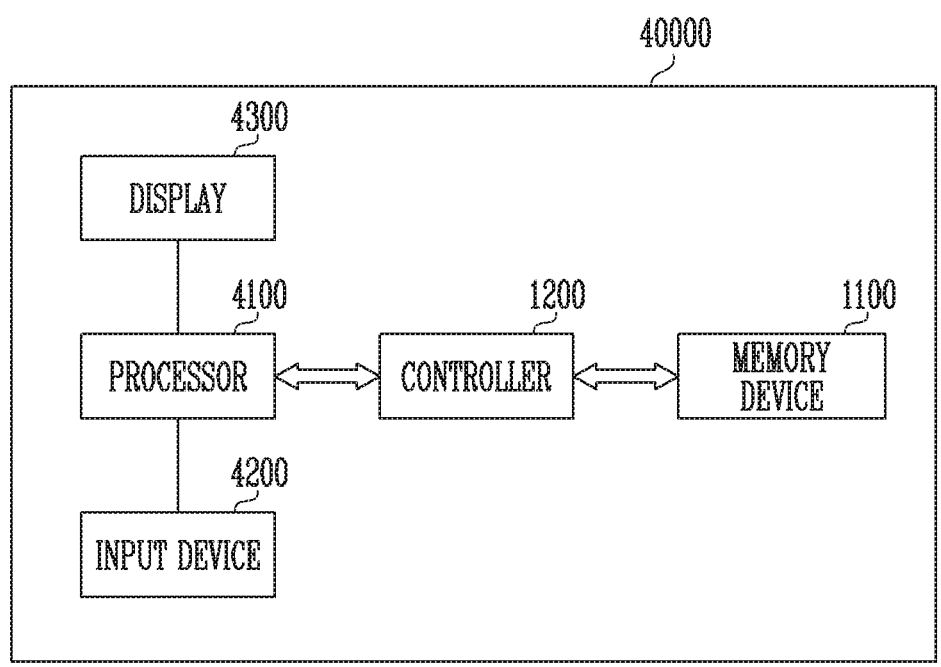
FIG. 17 is a diagram describing another embodiment of the memory system.

FIG. 17 is a diagram describing another example of the memory system.

Referring to FIG. 17, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data processing operation of the storage device 1100.

A processor 4100 may output data stored in the memory device 1100 through a display 4300, according to data input through an input device 4200. For example, the input device 4200 may be implemented as a point device such as a touch pad, a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100. In addition, the memory device 1100 may include the interface circuit 400, such as the memory device 1100 shown in FIG. 1 or the memory device 1100 shown in FIG. 15. In addition, when the memory device 1100 includes only a semiconductor memory as shown in FIG. 14, an interface circuit for data communication between the controller 1200 and the memory device 1100 may be additionally provided. At this time, the interface circuit may be configured as the interface circuit 400 of FIG. 2.

Figure 18:
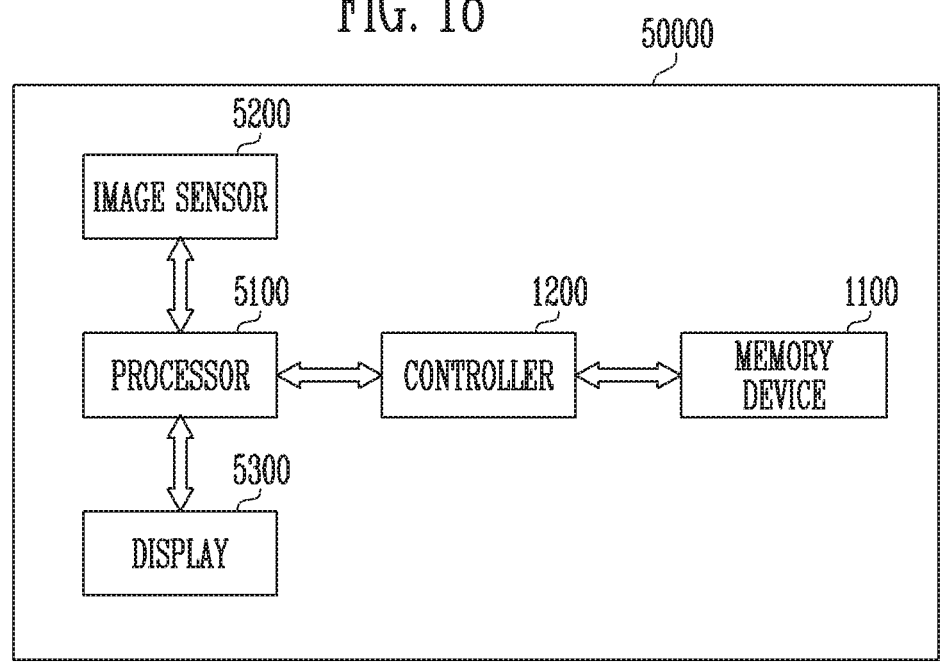
FIG. 18 is a diagram describing another embodiment of the memory system.

FIG. 18 is a diagram describing another embodiment of the memory system.

Referring to FIG. 18, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data processing operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under the control of the processor 5100, the converted digital signals may be output through a display 5300 or stored in the memory device 1100 through the controller 1200. Data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100. In addition, the memory device 1100 may include the interface circuit 400, such as the memory device 1100 shown in FIG. 1 or the memory device 1100 shown in FIG. 15. In addition, when the memory device 1100 includes only a semiconductor memory as shown in FIG. 14, an interface circuit for data communication between the controller 1200 and the memory device 1100 may be additionally provided. At this time, the interface circuit may be configured as the interface circuit 400 of FIG. 2.

Figure 19:
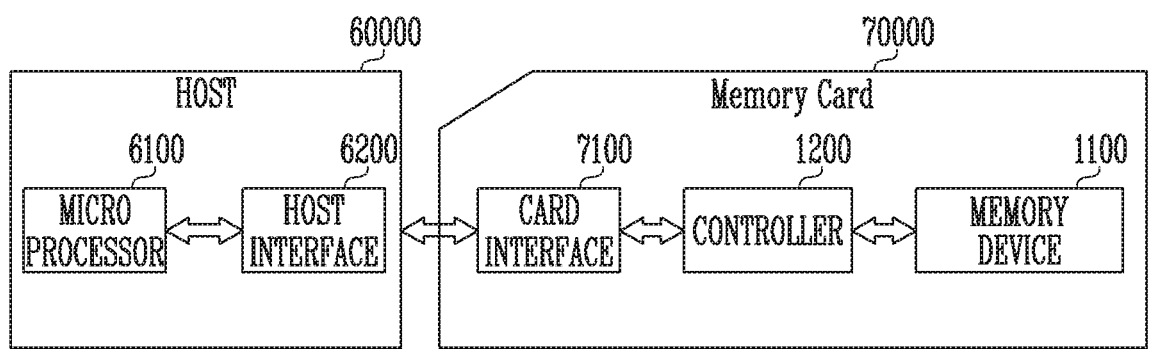
FIG. 19 is a diagram describing another embodiment of the memory system.

FIG. 19 is a diagram describing another embodiment of the memory system.

Referring to FIG. 19, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory device 1100 may include the interface circuit 400, such as the memory device 1100 shown in FIG. 1 or the memory device 1100 shown in FIG. 15. In addition, when the memory device 1100 includes only a semiconductor memory 100 as shown in FIG. 14, an interface circuit for data communication between the controller 1200 and the memory device 1100 may be additionally provided. At this time, the interface circuit may be configured as the interface circuit 400 of FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the present invention disclosure describes specific embodiments, various changes and modifications may be made without departing from the scope and technical spirit of the present invention disclosure. Therefore, the scope of the present invention disclosure should not be limited to the above-described embodiments, but should be determined by the equivalents of the claims of the present invention disclosure as well as the following claims.

Although the present invention disclosure has been described with reference to the limited embodiments and drawings, the present invention disclosure is not limited to the embodiments described above, various changes and modifications may be made from the disclosed description by those skilled in the art to which the present invention disclosure pertains.

In the embodiments described above, all of the steps may optionally be performed or omitted. Also, the steps in each embodiment need not occur in order, but may be reversed. Moreover, the embodiments of the present invention disclosure disclosed in this specification and the drawings are only illustrative of specific examples for the purpose of easily describing technical contents of this specification and understanding this specification, and are not intended to limit the scope of this specification. That is, it is apparent to those skilled in the art to which the present invention disclosure pertains that other modification examples based on the technical spirit of the present invention disclosure are possible.

Furthermore, this specification and the drawings disclose the preferred embodiments of the present invention disclosure, and although specific terms are used, they are used in general meaning for purposes of easily describing technical contents of the present invention disclosure and understanding of the present invention disclosure, and are not intended to limit the scope of the present invention disclosure. It is apparent to those skilled in the art to which the present invention disclosure pertains that other modification examples based on the technical spirit of the present invention disclosure may be carried out in addition to the embodiments disclosed herein.

Therefore, the scope of the present invention disclosure should not be limited to the described embodiments, but should be determined by the equivalents of the claims, as well as the following claims.

What is claimed is:

1. A memory system comprising:
    a memory device including an interface circuit, the interface circuit storing first system data, and a semiconductor memory, the semiconductor memory storing second system data; and
    a controller configured to output a read enable signal and a first read command for the first system data to the memory device,
    wherein the semiconductor memory transfers a data strobe signal to the interface circuit in response to the read enable signal, and
    wherein the interface circuit reads the first system data in response to the first read command and transmits the read first system data to the controller in synchronization with the data strobe signal.

2. The memory system according to claim 1, wherein the interface circuit transfers the read enable signal to the semiconductor memory, and
    wherein the semiconductor memory includes a data strobe signal generation circuit for generating the data strobe signal.

3. The memory system according to claim 1, wherein the interface circuit transmits the first read command to the semiconductor memory together with the read enable signal.

4. The memory system according to claim 3, wherein the semiconductor memory reads and provides the second system data to the interface circuit together with the data strobe signal in response to the first read command.

5. The memory system according to claim 4, wherein the interface circuit blocks the second system data.

6. The memory system according to claim 4, wherein the interface circuit comprises:

a timing control circuit configured to control a timing of the first read command and the read enable signal received from the controller and output the first read command and the read enable signal;

a processor configured to receive and parse the first read command output from the controller and generate a blocking control signal and a data read signal when the first read command corresponds to the interface circuit as a result of the parsing;

a data storage circuit configured to store the first system data, and output the first system data in synchronization with the data strobe signal in response to the data read signal; and a blocking control circuit configured to transmit to the semiconductor memory the first read command and the read enable signal received from the timing control circuit, receive the data strobe signal and the second system data from the semiconductor memory, and block the second system data in response to the blocking control signal.

7. The memory system according to claim 4, wherein the first system data is status data, read training data, or option parameter data of the interface circuit, and wherein the second system data is the status data, the read training data, or the option parameter data of the semiconductor memory.

8. The memory system according to claim 4, wherein the controller is further configured to output a second read command for second system data stored in the semiconductor memory, wherein the interface circuit transfers the second read command and the read enable signal to the semiconductor memory, and wherein the interface circuit transfers the second system data and the data strobe signal from the semiconductor memory to the controller.

* * * * *